US012562339B2

(12) United States Patent

Harmsen

(10) Patent No.: US 12,562,339 B2

(45) Date of Patent: Feb. 24, 2026

(54) METHOD FOR HANDLING A PARTICLE BEAM SYSTEM, PARTICLE BEAM SYSTEM, COMPUTER AND COMPUTATIONAL SYSTEM

(71) Applicant: Carl Zeiss Microscopy GmbH, Jena (DE)

(72) Inventor: Lucas Harmsen, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 312 days.

(21) Appl. No.: 18/360,563

(22) Filed: Jul. 27, 2023

(65) Prior Publication Data

US 2025/0037968 A1 Jan. 30, 2025

(51) Int. Cl.
*H01J 37/302* (2006.01)
*H01J 37/147* (2006.01)

(52) U.S. Cl.
CPC ...... *H01J 37/3023* (2013.01); *H01J 37/1474* (2013.01); *H01J 2237/24585* (2013.01); *H01J 2237/30455* (2013.01)

(58) Field of Classification Search
CPC .. H01J 37/1474; H01J 37/222; H01J 37/3023; H01J 37/3026; H01J 2237/24585; H01J 2237/30455
See application file for complete search history.

(56) References Cited

U.S. PATENT DOCUMENTS

| | | | | |
|---|---|---|---|---|
| 4,907,287 A | * | 3/1990 | Homma | H01J 37/222 |
| | | | | 250/397 |
| 10,840,059 B2 | * | 11/2020 | Shigeoka | H01J 37/28 |
| 2020/0365368 A1 | * | 11/2020 | Goto | H01J 37/304 |

FOREIGN PATENT DOCUMENTS

WO WO-2012099190 A1 * 7/2012 ........... G06T 7/0004

OTHER PUBLICATIONS

[No Author Listed], "AC Ripple Simulator Web App," Zeiss, available on or before Jun. 2022, 7 pages.

* cited by examiner

*Primary Examiner* — David E Smith

(74) *Attorney, Agent, or Firm* — Fish & Richardson P.C.

(57) ABSTRACT

A method of operating a particle beam system comprises providing a model which outputs an output image based on a simulation of the particle beam system, generating vibration data from vibrations measured at the installation site, setting values of parameters of an intended operation of the system, providing an input image to the model, inputting the vibration data and the set values of the parameters into the model, and act based on an analysis of the output image. Straight lines in the input image correspond to straight lines in the output image if the vibrations are of a low intensity. Straight lines in the input image correspond to non-straight lines in the output image if the vibrations are of a high intensity. The parameters represent at least one of a working distance, a kinetic energy of particles incident on the sample, and a scan speed.

21 Claims, 8 Drawing Sheets

METHOD FOR HANDLING A PARTICLE BEAM SYSTEM, PARTICLE BEAM SYSTEM, COMPUTER AND COMPUTATIONAL SYSTEM

FIELD

The present disclosure relates to a method for handling a particle beam system, a particle beam system, a computer and a computational system. For example, the present disclosure relates to an installation of a particle beam system and/or an adjustment of operational parameters of a particle beam system.

BACKGROUND

In scanning particle beam systems, a particle beam is generated by a particle beam source and is then focused onto a surface of an object. Such particle beam systems can acquire images by directing the particle beam onto a specific incidence location on the object and detecting an amount of particles that are resultantly emitted by the object and that are incident on a detector. The amount of particles detected by the detector is generally reflected by a detection signal generated by the detector. The image can be generated by associating each detection signal with a respective incidence location on the object after directing the particle beam to multiple incidence locations.

However, when acquiring two particle-optical images of a same sample with two particle beam systems of a same type operated with the same operational parameters at two different installation sites, there may still be a noticeable difference between the particle-optical images due to vibrations occurring at the installation site.

Thus, a quality of images acquired by a particle beam system at an installation site may not suffice for a desired usage. For example, different images for different installation sites may also not be available. Thus, it can be difficult to assess whether or not the quality of images acquired by the particle beam system at the installation site suffices for the desired usage.

SUMMARY

The present disclosure seeks to provide methods for an easier assessment of a relevance of the issues discussed in the background.

In an aspect, the disclosure provides a method for handling a particle beam system which comprises providing a computational model which receives an input image, values of operational parameters defining an operation of the particle beam system and vibration data representing vibrations of the particle beam system and which outputs an output image based on a simulation of the operation of the particle beam system.

According to some embodiments, the method further comprises measuring vibrations at the installation site using at least one vibration sensor, and generating vibration measurement data representing the measured vibrations, setting values of the operational parameters of an intended operation of the particle beam system, providing the input image, inputting the vibration measurement data and the set values of the operational parameters into the computational model and receiving the output image output from the computational model, performing an action based on an analysis of the output image. The simulation can operate such that features of the input image represented as straight lines correspond to features of the output image represented as straight lines if the vibration data represent vibrations of a low intensity and features of the input image represented as straight lines correspond to features of the output image represented as non-straight lines if the vibration data represent vibrations of a high intensity. The operational parameters can represent at least one of a working distance between an objective lens of the particle beam system and a sample to be inspected with the particle beam system, a kinetic energy of particles incident on the sample, and a scan speed used when scanning the beam of particles across the sample when an image is recorded using the particle beam system. Particles of a particle beam of the particle beam system may be electrons, ions, or the like.

Specifically, a low intensity of vibrations is defined by being smaller than the high intensity of the vibrations. For example, straight lines may gradually become more non-straight as the intensity of vibrations increases. In addition, directions in which portions of the non-straight lines are displaced from the reference line may depend on the scan speed and/or a frequency of the vibrations.

For example, the above described difference between two images acquired at different installation sites may be caused by seismic and acoustic vibrations at the installation site. When the particle beam system follows the seismic vibrations of a floor of the installation site, a stage holding the sample of the particle beam system may moves. Thus, the incidence locations on the moving sample cannot be properly determined by the particle beam system. For example, this may be seen in a particle-optical image by undulating edges of the sample, where straight edges should be visible. It is to be noted that the undulating edges may also occur, where curved edges should be visible. In such a case, the undulating edge may be referred to as a curved undulating edge. Although undulating edges are examples of non-straight lines, it should be noted that the non-straight lines are not necessarily undulating. For example, non-straight lines may be aperiodic.

The computational model is, for example, an algorithm that simulates, how an image of a sample will look like when acquired by the particle beam system installed at the installation site, thus being influence by the seismic and acoustic vibrations occurring at the installation site. For example, this algorithm may involve an image to be input. If this input image is a predetermined test image, which may be provided by the algorithm, for example, in a source code of the algorithm, the test image may be an image acquired by another particle beam system in substantially perfect conditions. For example, the test image may be a result of an acquisition of a particle beam system in an environment in which seismic and acoustic vibrations are strongly suppressed, such that these vibrations have little to no influence on the test image acquisition. Therefore, when inputting such a test image into the algorithm, a user of the particle beam system to be installed may already see a difference between an ideal image and a result of an image acquisition at the installation site before the particle beam system is installed. Thus, the user is able to decide whether the particle beam system should be installed at the installation site or not. For example, the user's decision may also comprise additional measures to be taken during the installation of the particle beam system, such as installing vibration dampers, an acoustic insulation or the like, such that vibrations at the installation site are suppressed. It should be noted that the input image may also be a simulated image or any other image.

The computational model may be realized by raytracing trajectories of single particles with respect to components of the particle beam system, for example with respect to the stage, a detector and a deflector arrangement of the particle beam system. A raytracing of the trajectories is able to relatively precisely determine differences between a desired incidence location and an actual incidence location under the influence of the movement of the stage according to the vibrations. Alternatively, the computational model may be realized by other algorithms. For example, a machine learning algorithm may be trained with a data set generated by artificially creating vibrations during an acquisition of a particle beam system and associating the image with a frequency and a magnitude of the artificial vibrations. In this case, the computational model can be an inference model to infer an image with given vibration measurement data. Also, the movement of the stage due to the seismic and acoustic vibrations may be described by a differential equation, which can be solved by a finite elements algorithm.

Since a movement of the stage of the particle beam system depends on the vibrations at the installation site, the movement of the stage is small for a low magnitude of vibrations and increases for higher magnitudes of vibrations. It is to be noted that the movement of the stage of the particle beam system is not necessarily directly proportional to a quality of the image, for example to the occurrence of non-straight lines in the acquired image. For example, the occurrence of non-straight lines in the acquired image also depends on a scan strategy and a scan speed of the particle beam system. In addition, a direction in which portions of the non-straight lines are displaced from the above described reference line may depend on the scan strategy and the scan speed of the particle beam system. The scan strategy describes an arrangement of incidence locations of the particle beam and is mainly set by a controller of the particle beam system via a deflector arrangement of the particle beam system. For example, the particle beam system may be directed successively to a discrete set of incidence locations on the sample, wherein the incidence location of the particle beam is maintained over a period of time, which is typically called dwell time, and moved between the incidence locations with a high velocity, which is hereinafter called a partial scan speed. The scan speed specifies the overall speed of the scan, which may be determined, for example, by dividing the distance between two scan points by the time involved to move the particle beam from one scan point to the other scan point combined with the dwell time. Alternatively, the scan speed may be determined by dividing the amount of scan points by the overall time involved for the image acquisition, or the like.

Depending on the scan strategy and the scan speed described above, a resonance may occur between the movement of the stage of the particle beam system and the scan of the particle beam. Thus, the severeness of the non-straight lines occurring in an acquired image is not necessarily linearly higher with stronger vibrations at the installation site.

The distance between an objective lens of the particle beam system and the sample to be inspected with the particle beam system is typically called the working distance. For example, the working distance is defined between the sample and a lower end of the objective lens. It should be noted that it may desirable for the working distance to be determined by other algorithms, because the size of the sample is usually not known in detail.

The particles may be electrons, for example. The kinetic energy of the particles incident on the sample is defined by the difference between a potential supplied to the particle beam source and the potential provided to the sample. For example, the sample can be provided with a specific potential by providing a respective potential to the stage of the particle beam system. Since the kinetic energy of the particles incident on the sample directly define the physical processes inside the sample for reemitting particles, this kinetic energy of the particles incident on the sample is relevant to the computational model.

According to some embodiments, measuring the vibrations includes measuring of seismic vibrations of a floor at the installation site, and measuring of acoustical vibrations of air at the installation site. A measurement of acoustic vibrations involves a contact area between the sensor and the air at the installation site, and a measurement of seismic vibrations involves a contact area between the sensor and at least one of a wall or the floor at the installation site. In addition, vibration sensors come with different frequency ranges and sensitivities, so it may be desirable to use a dedicated acoustic sensor and a dedicated seismic sensor to be able to measure both types of vibrations properly.

According to some embodiments, the action comprises installing of the particle beam system at the installation site. As previously mentioned above, the decision to install the particle beam system may include further decisions on the installation process itself. For example, the user of the particle beam system may decide to install the particle beam system with vibration suppression to improve a quality of particle-optical images acquired with the particle beam system at the installation site. In addition, the user may decide to eliminate sources of the acoustic and seismic vibrations, or to install the particle beam system at another installation site with less acoustic and seismic vibrations.

According to some embodiments, the action comprises refraining from installing of the particle beam system at the installation site.

According to some embodiments, the action comprises recording a particle-optical image using the particle beam system. In such embodiments, the user may perform the above described measurement of vibrations at the installation site by himself, and input corresponding measurement data into the software running on his particle beam system. The particle beam system may comprise the computational model or transmit the measurement data to another computer comprising the computational model. With the same measurement data, the user is able to repeatedly receive output images from the computational model by inputting different values of the operational parameters. Thus, the user can determine from the resulting output images which values of the operational parameters are optimal to compensate the effects of the measured vibrations when acquiring images with his particle beam system. The user may then operate the particle beam system with the values of the operational parameters for which the quality of the image is determined to be optimal. In other words, if the user notices that an acquired image is strongly influenced by vibrations, the user may repeatedly test different values of the operational parameters without the need to operate the particle beam system every time, thus preventing the sample from being damaged.

According to some embodiments, the performing of the action based on the analysis of the output image comprises receiving an input triggering the action from a user. For example, the current values of the operational parameters may be automatically set in the particle beam system after the user confirms that the current output image received from the computational model is sufficient for his desired usage. This may be realized by pressing a button, giving a voice command or the like. Alternatively, the user may manually set the values of the operational parameters in the particle beam system.

According to some embodiments, the method comprises providing a computational model which receives an input image, values of operational parameters defining an operation of the particle beam system and vibration data representing vibrations of the particle beam system and which outputs an output image based on a simulation of the operation of the particle beam system, receiving vibration measurement data representing vibrations, setting values of the operational parameters of an intended operation of the particle beam system, providing the input image, inputting the vibration measurement data and the set values of the operational parameters into the computational model and receiving the output image output from the computational model, and outputting the output image. The simulation can operate such that features of the input image represented as straight lines correspond to features of the output image represented as straight lines if the vibration data represent vibrations of a low intensity, and features of the input image represented as straight lines correspond to features of the output image represented as non-straight lines if the vibration data represent vibrations of a high intensity. The operational parameters represent at least one of a working distance between an objective lens of the particle beam system and a sample to be inspected with the particle beam system, a kinetic energy of particles incident on the sample, and a scan speed used when scanning the beam of particles across the sample when an image is recorded using the particle beam system.

The method according to such embodiments may be performed on a computer by running a software program. In such a case, the software program may comprise instructions that cause a computer to perform the method according to this embodiment. It is to be noted that the computer may be included in the particle beam system, or may be an external computer. The external computer may be connected to the particle beam system through a network, such as the Internet. For example, the particle beam system may show a user interface that enables the user to input the measurement data and the values of the operational parameters, which may then be transmitted to the external computer through the network. The output image received from the computational model is, in this case, transmitted back to the particle beam system, such that the output image can be displayed in the user interface.

According to some embodiments, the setting of the values includes receiving the values from a user. Alternatively, the values may be iteratively set to different sets of values, such that multiple output images are generated automatically. All generated output images may be displayed to the user in the user interface described above. As an example, iteratively setting the values and comparing the output image with multiple input images with known measurement data and known operational parameters may be used to train a machine learning model as the computational model to generate the output image.

According to some embodiments, the receiving of the values from the user includes providing a user interface to the user, wherein the user interface provides a widget for allowing the user to input the values, and the receiving further includes obtaining the values inputted by the user from the widget. For example, the widget may include a drop-down menu, a slide bar, a text box or the like. In addition, the user interface may provide a function for reading and obtaining data from data files. Such data files may contain the measurement data, the values of the operational parameters, or both. For example, the user may be able to input a directory of the data file containing the data into the user interface and, upon giving an indication that the output image is to be generated, the data file may be uploaded to the external computer. Such an indication may be realized by pressing a button, giving a voice command or the like. Allowing the user to provide a data file containing data can be desirable with respect to the measurement data, since it may be tedious to manually input measurement data with a desired accuracy into the user interface. However, the user interface may provide both the function to read data files containing data and the widget to input the data manually.

According to some embodiments, the user interface is provided by a first program module that is executed by a first computer, and the computational model is provided by a second program module that is executed by a second computer that is different from the first computer. As previously described above, the first computer may be the particle beam system running the user interface, and the second computer may be the external computer running a program including the computational model.

According to some embodiments, inputting the vibration measurement data and the set values of the operational parameters into the computational model comprises transmitting the vibration measurement data and the values of the operational parameters from the first computer to the second computer, and the receiving of the output image output from the computational model comprises receiving the output image from the second computer by the first computer. For example, the user interface will, upon indication by the user that an output image is to be generated, transmit all desired data to the external computer through the network, and will receive the output image from the external computer through the network. The output image may then be displayed in the user interface.

According to some embodiments, the method further comprises generating a document including the output image, wherein the document further includes values of program parameters that have been used in the computational model to output the output image. For example, this document may be shown in the user interface. In addition, the document may be a digital document in the PDF format or other common formats of digital documents, such that the document may be printed or sent by email.

According to some embodiments, the program parameters represent at least one of a magnification of the particle beam system, the working distance between the objective lens of the particle beam system and the sample to be inspected with the particle beam system, the kinetic energy of particles incident on the sample, and the scan speed used when scanning the beam of particles across the sample when an image is recorded using the particle beam system.

According to some embodiments, the provided input image is predetermined. It is to be noted that the input image is not necessarily a particle-optical image or similar to a particle-optical image. The input image may be any image.

According to some embodiments, the predetermined image is a particle-optical image acquired by operating another particle beam system that is different from the particle beam system. For example, the predetermined image may be the above described test image. The test image may be acquired, for example, by the manufacturer of the particle beam system in a controlled environment with a low vibration intensity.

According to some embodiments, providing the input image comprises acquiring a particle-optical image by operating the particle beam system. In this embodiment, the user is able to input a customized input image. In this case, the input image may represent, for example, a sample that is to be imaged by the particle beam system and thus better reflects the desired usage of the particle beam system.

According to some embodiments, a line in the image is a straight line if all osculating circles to the line have a diameter of more than two times a greatest width of the image, and the line in the image is a non-straight line if at least one osculating circle to the line has a diameter less than half of the greatest width of the image. For example, an osculating circle is a circle to which the line is tangential, such that a curvature of the circle is equal to the curvature of the line. Furthermore, the greatest width of the image is a maximal length in the image, or in other words, a maximal extension of the image. For example, in the case of a two-dimensional image, the width of the greatest width of the image may be a diagonal of the image.

According to some embodiments, a particle beam system comprises a particle beam source configured to generate a particle beam, an objective lens configured to focus the particle beam onto a sample to be scanned with the particle beam system, a deflector arrangement configured to scan the particle beam across a surface of the sample, a detector configured to generate a signal corresponding to an amount of particles incident on the detector, a stage configured to hold the sample, a controller configured to control an operation of the particle beam source, an operation of the objective lens and an operation of the deflector arrangement, and configured to receive signals generated by the detector, and a computation module configured to perform the above described method. The controller is further configured to receive the values of the operational parameters from the computation module and to control the operation of the particle beam source, the operation of the objective lens and the operation of the deflector arrangement such that the particle beam system is operated with the values of the operational parameters, when the particle beam system is operated to acquire an image of the sample. For example, the computation model may be a circuit integrated in a housing of the particle beam system, or may be at least partially provided by an external circuit outside of the particle beam system. The particles, on which the generation of the detector signal is based, may be electrons, ions, photons or the like.

BRIEF DESCRIPTION OF THE DRAWINGS

The foregoing as well as other features of the disclosure will be more apparent from the following detailed description of exemplary embodiments with reference to the accompanying drawings. It is noted that not all possible embodiments exhibit each and every, or any, of the features identified herein.

DETAILED DESCRIPTION OF EXEMPLARY EMBODIMENTS

Figure 1:
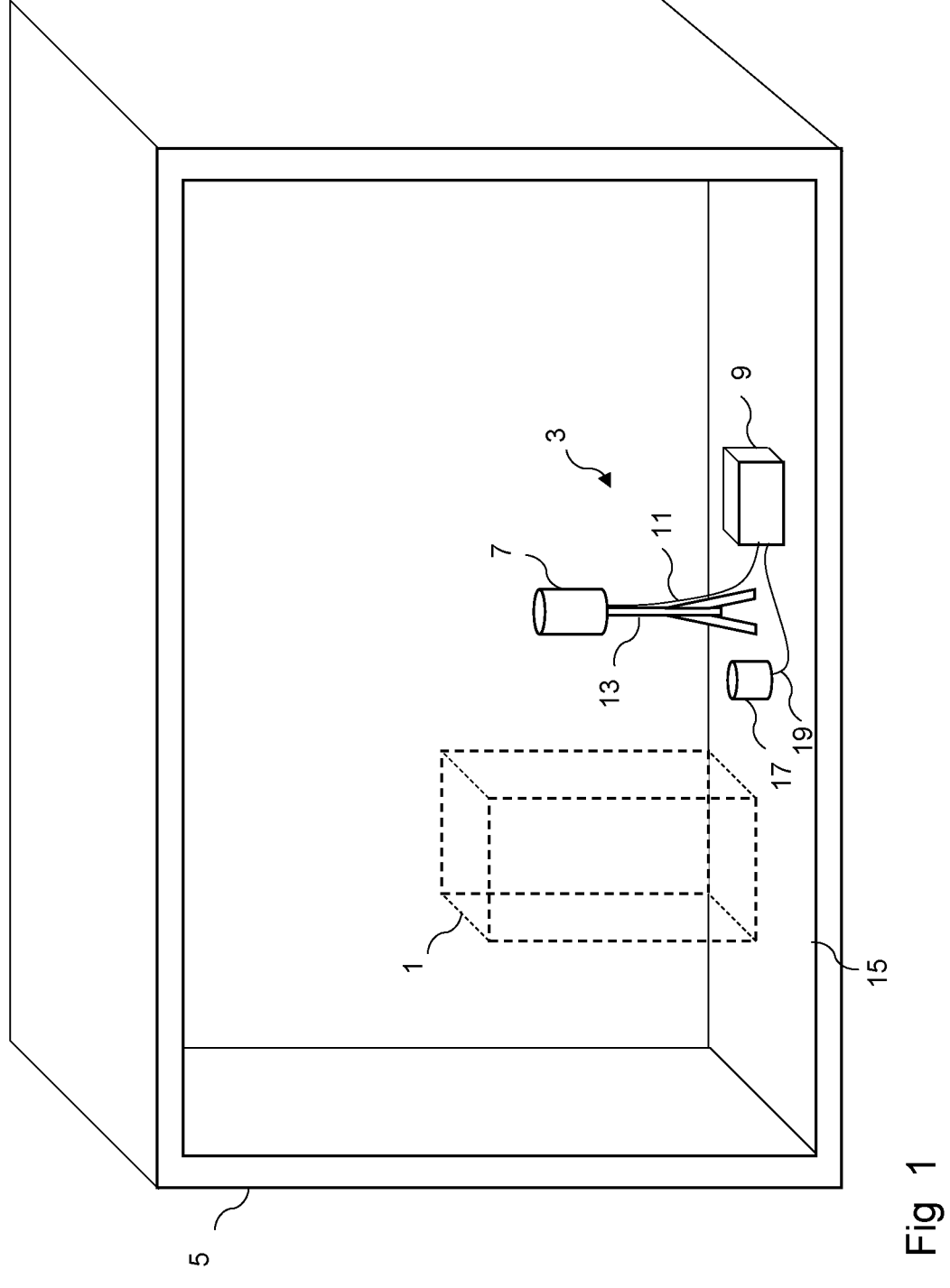
FIG. 1 illustrates an installation site and a sensor arrangement for measuring vibrations at the installation site.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 illustrates an installation site 1 of a particle beam system and a sensor arrangement 3 for measuring vibrations at the installation site 1. For example, the installation site 1 is located in a room 5 inside a building. In FIG. 1, the installation site 1 is depicted by broken lines to emphasize that a particle beam system 2 is not installed yet.

The sensor arrangement 3 comprises an acoustic sensor 7 measuring acoustic vibrations inside of the room 5. The acoustic sensor 7 is connected with a measurement processor 9 via a transmission line 11, such that the acoustic sensor 7 is able to transmit readings with respect to the acoustic vibrations to the measurement processor 9. In addition, the acoustic sensor 7 is supported by a tripod 13, such that the acoustic sensor 7 is elevated from a floor 15 of the room 5. In this way, the acoustic sensor 7 is less influenced by parasitic vibrations bouncing off the floor 15 of the room 5. The sensor arrangement 3 further comprises a seismic sensor 17 arranged on the floor 15 of the room 5, such that the seismic sensor 17 is able to directly measure vibrations of the floor 15. The seismic sensor 15 is connected to the measurement processor 9 through a transmission line 19, such that the seismic sensor 15 is able to transmit readings with respect to the vibrations of the floor 15 of the room 5 to the measurement processor 9. It is noted that the sensor arrangement 3 does not necessarily include multiple sensors, such as the acoustic sensor 7 and the seismic sensor 17. For example, the sensor arrangement 3 may only include a seismic sensor 17, or only an acoustic sensor 7.

The measurement processor 9 receives readings from the acoustic sensor 7 and the seismic sensor 17 through the transmission lines 11 and 19, respectively. The measurement processor 9 may then perform an initial processing of the readings, such as converting the raw data into data that can be read by commonly used applications of a computer. In addition, the measurement processor 9 stores the processed readings. The measurement processor 9 is also able to be connected to a computer, for example through a universal serial bus, to enable a transmission of the stored data to the computer. Alternatively, the measurement processor 9 may include a circuit that provide a wireless transmission with the computer.

It should be noted that, in FIG. 1, the measurement of the vibrations is not shown to be performed at the exact position of the installation site 1. However, the vibration measurement does not need to be performed at the exact position of the installation site 1, as long as the measured vibration are sufficiently representative of the vibrations at the position of the installation site 1. For example, it can be expected that the seismic vibrations measured at any point in the room 5 are very similar to the seismic vibrations at the position of the installation site 1. In specific embodiments, the measurement of the vibrations is performed at the exact position of the installation site 1.

Figure 2:
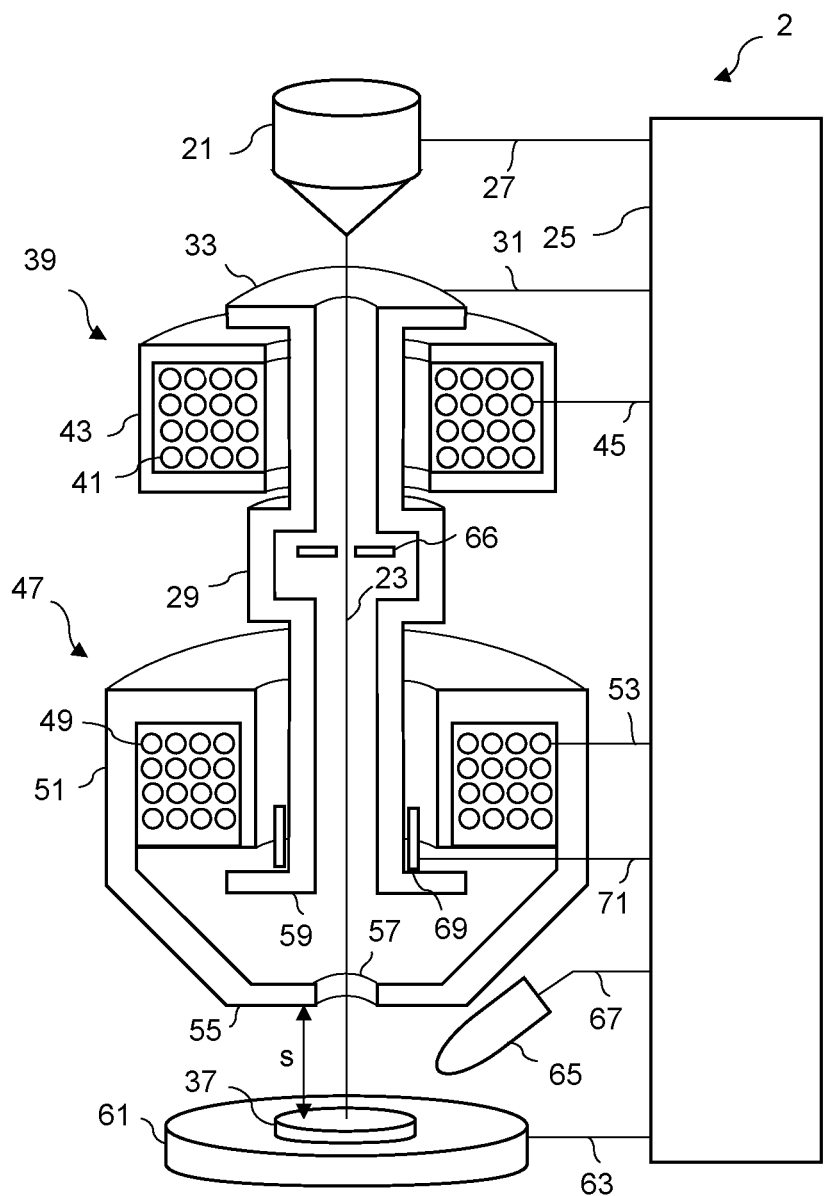
FIG. 2 illustrates a schematic cross-sectional view of a particle beam system to be installed at the installation site illustrated in FIG. 1.

FIG. 2 illustrates a schematic cross-sectional view of the particle beam system 2 to be installed at the installation site 1 illustrated in FIG. 1. The particle beam system 2 comprises a particle beam source 21 that is able to generate a particle beam 23. The particle beam source 21 is connected to a controller 25 of the particle beam system 2 through a lead 27, such that the controller 25 is able to supply a first electrical potential to the particle beam source 21.

The particle beam source 21 is, for example, a filament source that generates a particle beam 23 by heating a filament to emit particles from the filament and accelerating the particles in a direction away from the filament. The particle beam source 21 may be, however, any other particle beam source available. Thus, the particle beam source 21 will not be described in more detail here.

The particles of the particle beam 23 are additionally accelerated by a second potential supplied to a beam tube 29 through a lead 31 connecting the beam tube 29 to the controller 25. The second potential is supplied to the beam tube 29 by the controller 25. Since the second potential supplied to the beam tube 29 may be identical to an acceleration potential of the particle beam source 21, the potential supplied to the beam tube 29 may not additionally accelerate the particles of the particle beam 23. In the case of the particles of the particle beam 23 being electrons, the second potential is, for example, a high positive potential. Due to the second potential, the particles are accelerated towards the beam tube 29 by an upper end 33 of the beam tube 29 to have a high kinetic energy while traversing the beam tube 29. The second potential is supplied to the beam tube 29 to shorten a time of flight of the particles of the particle beam 23 to counteract various physical effects, one of which is an effect of an electromagnetic repulsion between the particles within the particle beam 23, which is decreased by a shortened time of flight. In other words, the electromagnetic repulsion of the particles within the particle beam 23 counteracts the focusing of the particle beam system 2 onto a sample 37, which would decrease a resolution of an acquired image. Thus, the decrease in resolution of the acquired image is reduced by shortening the time of flight of the particles of the particle beam 23.

Subsequently, the particles of the particle beam 23 enter the beam tube 29 and traverse a condenser lens 39. The condenser lens 39 comprises a set of coil windings 41 and a pole piece 43. As shown in FIG. 2, each coil of the set of coil windings 41 are arranged to radially surround the beam tube 29. The set of coil windings 41 is partially surrounded by the pole piece 43 formed by a material that is able to be magnetized.

The set of coil windings 41 is connected to the controller 25 through a lead 45. The controller 45 is able to supply a current to the set of coil windings 41 such that they generate a magnetic field, which protrudes from ends of the pole piece 43 into the beam tube 29 to deflect the particles of the particle beam 23. The magnetic field of the condenser lens 39 may be used to collimate the particle beam 23. It should be noted that the condenser lens 39 is not necessarily a magnetic lens as described above. For example, the condenser lens 39 may also be an einzel lens formed by multiple cylindrical electrodes arranged along the beam tube 29.

The particle beam 23 then traverses an objective lens 47. Similar to the condenser lens 39, the objective lens 47 is a magnetic lens in the example shown in FIG. 2. However, the objective lens 47 may be another suitable lens, such as an einzel lens formed by multiple cylindrical electrodes arranged along the beam tube 29. The objective lens 47 comprises a set of coil windings 49 and a pole piece 51. The set of coil windings 49 radially surrounds the beam tube 29 and is connected to the controller 25 through a lead 53, such that the controller 25 is able to supply a current to the set of coil windings 49. The set of coil windings 49 is partially surrounded by the pole piece 51 that has a gradually decreasing outer diameter along the direction of travelling of the particle beam 23. At its lowermost point in the direction of travelling of the particle beam 23, the pole piece 51 has a lower end 55 with a through hole 57.

The beam tube 29 has a lower end 59 that is arranged between the set of coil windings 49 and the lower end 55 of the pole piece 51 of the objective lens 47. Thus, when the controller 25 supplies a current to the set of coil windings 49, the magnetic field generated by the set of coil windings 49 protrudes into the path of the particle beam 23 at and below a lower end 59 of the beam tube 29.

The objective lens 47 is used to focus the particle beam 23 onto the sample 37. This is done to improve the resolution of images acquired by the particle beam system 2.

After traversing the through hole 57 of the pole piece 51 of the objective lens 47, the particle beam 23 is incident on the sample 37. For example, a distance between the sample and the lower end 55 of the pole piece 51 of the objective lens 47 is defined as a working distance s. It is noted that it may be desirable to determine this working distance s by further software that is, for example, executed by the controller 25, since the size of the sample 37 is usually unknown.

The sample 37 is arranged on a stage 61 that is connected to the controller 25 through a lead 63. Thus, the controller 25 is able to supply a third electrical potential to the stage 61. By supplying the third electrical potential to the stage 61, the third electrical potential is also supplied to the sample 37. For example, a kinetic energy of the particles of the particle beam 23 incident on the sample 37 is defined by the difference between the first electrical potential supplied to the particle beam source 21 and the third electrical potential supplied to the sample 37.

Since the sample 37 is supplied with a third electrical potential, an electrostatic field is formed between the sample 37 and the lower end 59 of the beam tube 29. In other words, an electrostatic field is formed between the second electrical potential and the third electrical potential. In addition, since the lower end 59 of the beam tube 29 is arranged between the set of coil windings 49 and the lower end 55 of the pole piece 51, the lower end 59 of the beam tube 29 forms a combined lens with the objective lens 47, meaning that the magnetic field of the objective lens 47 significantly overlaps with the electrostatic field between the sample 37 and the lower end 59 of the beam tube 29. This also means that the focusing of the particle beam 23 is performed by the combination of the magnetic field of the objective lens 47 and the electrostatic field between the lower end 59 of the beam tube 29 and the sample 37. It should be noted that the effect of the electrostatic field between the sample 37 and the lower end 59 of the beam tube 29 strongly depends on an electrical potential of the lower end 55 of the pole piece 51, since the electrostatic field between the sample 37 and the lower end 59 of the beam tube 29 consists of a first partial electrostatic field between the lower end 59 of the beam tube 29 and the lower end 55 of the pole piece 51, and a second partial electrostatic field between the lower end 55 of the pole piece 51 and the sample 37. Specifically, the lower end 55 of the pole piece 51 may be provided with an electrical potential of 0 Volts or an electrical potential that is different from 0 Volts.

When the particles of the particle beam 23 are incident on the sample 37, the sample 37 emits electrons. It should be noted that the type of emitted particles by the sample 37 upon incidence of the particle beam 23 depends on the physical interactions of the particle beam 23 with the sample 37. For example, the sample 37 may also emit particles such as photons, which corresponds to a case in which the sample 37 emits radiation. Additionally or alternatively, the sample 37 may also emit ions. However, for the ease of explanation, the emission of any other particles than electrons upon incidence of the particle beam 23 is not further described herein. A kinetic energy spectrum of the emitted electrons and an amount of the emitted electrons depends on a structure and a composition of the sample 37 at the incidence location.

The particle beam system 2 further comprises a detector 65 that is able to generate a signal corresponding to an amount of electrons incident on the detector 65. The detector 65 is able to transmit the generated signal through a lead 67 to the controller 25 for further processing. Although the detector 65 is described in detail here, the same or similar functions may be implemented by an in-lens detector 66 arranged in the beam tube 29. The detector 65 may comprise, for example, a scintillator crystal to be able to acquire the kinetic energy of the electrons incident on the detector 65. However, the detector 65 may use any suitable technique for detecting an amount of electrons.

In addition, the particle beam system 2 comprises a deflector arrangement 69 that is connected to the controller 25 through a lead 71. The deflector arrangement 69 shown in FIG. 2 includes two pairs of electrodes at different sides of the beam tube 29, each pair of electrodes consisting of two opposing electrodes. By applying a voltage to the deflector arrangement 69 by the controller 25, an electric field is generated between the electrodes, deflecting the particles of the particle beam 23. Thus, an incidence location on the sample 37 corresponds to a specific voltage supplied to the deflector arrangement 69. The deflector arrangement 69 may, additionally or alternatively, include a coil for electromagnetically deflecting the particle beam 23, in which case the controller 25 supplies a current to the coil to electromagnetically deflect the particle beam 23.

The controller 25 stores the signal of the detector 65 in association with the voltage supplied to the deflector arrangement 69 corresponding to the incidence location of the particle beam 23 on the sample 37. Thus, when scanning the particle beam 23 over the sample 37 by directing the particle beam 23 to different incidence locations on the sample 37 successively, an image can be generated by associating the signal of the detector 65, which corresponds to a pixel intensity, with the respective incidence locations of the particle beam 23 on the sample 37, which correspond to pixel coordinates of the image.

When vibrations occur, it may be the case, for example, that the stage 61 moves relatively to the deflector arrangement 69, thus displacing the sample 37 and the actual incidence location on the sample 37 from the expected incidence location on the sample 37. Thus, artifacts may occur in an image acquired by the particle beam system 2.

Figure 3:
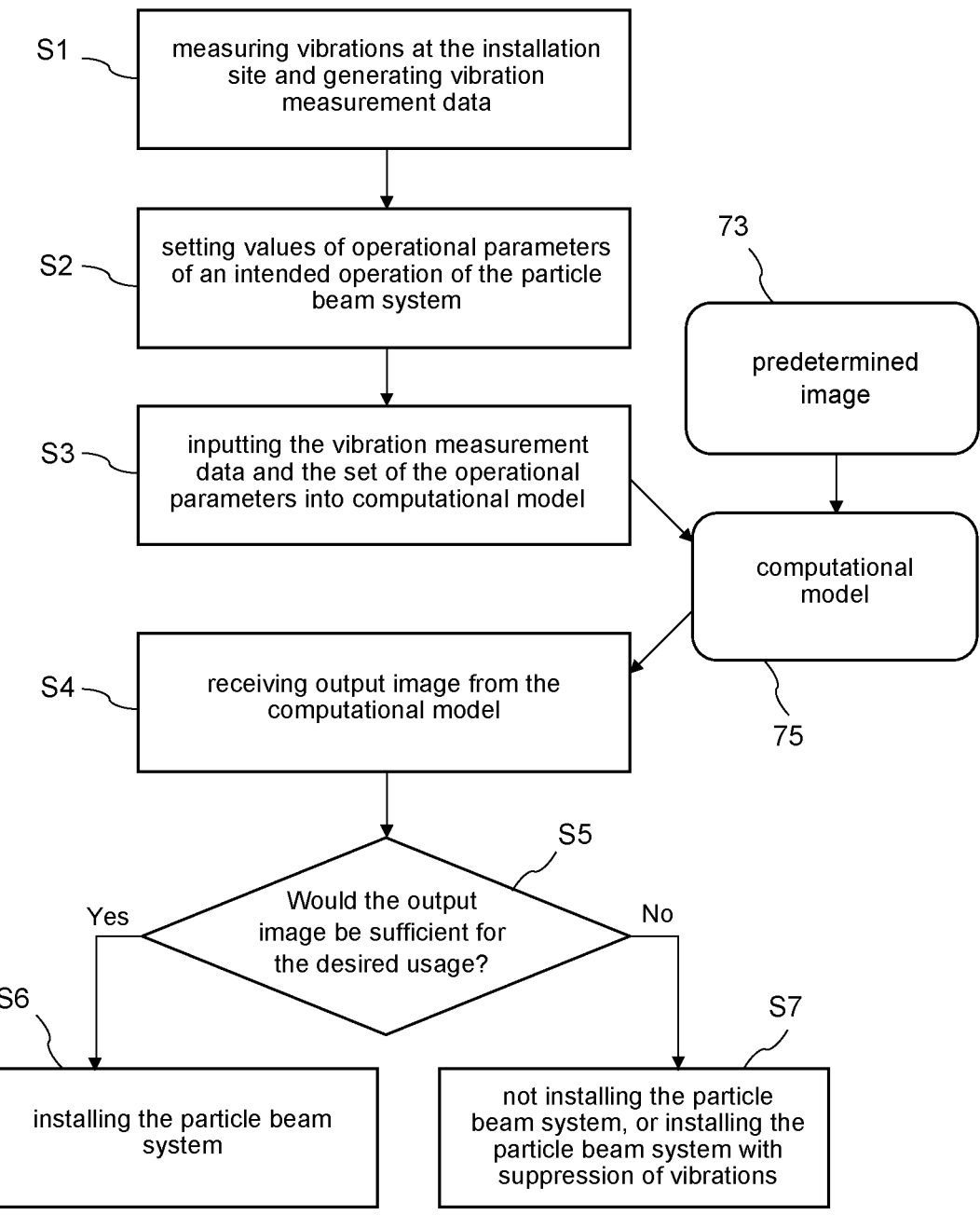
FIG. 3 illustrates a flowchart showing the method according to an embodiment.

FIG. 3 illustrates a flowchart showing the method according to an embodiment. The method includes steps S1 to S7 and relies on a predetermined input image 73 and a computational model 75.

In step S1, the vibrations at the installation site 1 are measured with the sensor arrangement 3. For example, this step S1 is performed by a service worker and is performed before the particle beam system 2 is to be installed. Further, in step S1, vibration measurement data is generated from the readings of the sensors 7 and/or 17. The generation of vibration measurement data includes, for example, a conversion of the raw readings of the sensors 7 and 17 into a text file that can be read by commonly used operating systems. Step S1 may be performed after performing step S2.

The service worker then sets values of operational parameters of an intended operation of the particle beam system 2 in the user interface in step S2. This means that the service worker may, for example, set a rather high magnification, if the particle beam system 2 is supposed to be used for structural analysis of condensed matter. For this, the service worker may request a typically used set of values of operational parameters from the user of the particle beam system 2. Alternatively, setting the values of the operational parameters in step S2 may also be performed by the user of the particle beam system 2.

The values of the operational parameters of the intended operation of the particle beam system 2 in step S2 are set by the service worker in a user interface provided, for example, on a table computer of the service worker. The user interface will be described later. The service worker is also able to input the vibration measurement data recorded with the sensor arrangement 3 in the user interface in step S2. Specifically, the user interface provides the possibility to input a directory of the text file generated in step S1 to input the vibration measurement data.

When submitting the settings performed in step S2, the tablet computer of the service worker transmits the text file containing the vibration measurement data and the set values of the operational parameters to an external computer in step S3. The external computer runs a program that provides the computational model 75 and holds a predetermined image 73. The vibration measurement data and the values of the operational parameters received by the external computer are then input into the computational model 75 together with the predetermined image 73 provided on the external computer.

The computational model 75 outputs, in step S4, an output image representing an image that would have been acquired by the particle beam system 2, if the particle beam system 2 was already installed at the installation site 1. Also in step S4, the output image is transmitted from the external computer to the tablet computer of the service worker, such that the service worker is able to show the received output image to the user of the particle beam system 2. The service worker may also print the output image or send the output image in an email.

The user of the particle beam system 2 is then able to decide whether or not a quality of the output image suffices for the desired usage in step S5. If the quality of the output image suffices for the desired usage, the user will proceed with step S6 and the installation of the particle beam system 2. If the quality of the output image is not sufficient for the desired usage, the user has several possibilities to proceed in step S7. First, the installation may be canceled. However, it may also be sufficient to install an additional suppression of the vibrations at the installation site 1, such as vibration dampers, an acoustic insulation or the like.

For this decision, the user interface may include a widget to set a percental suppression of the vibrations, such that the user is able to assess the influence of a suppression of the vibrations in further output images.

Figure 4:
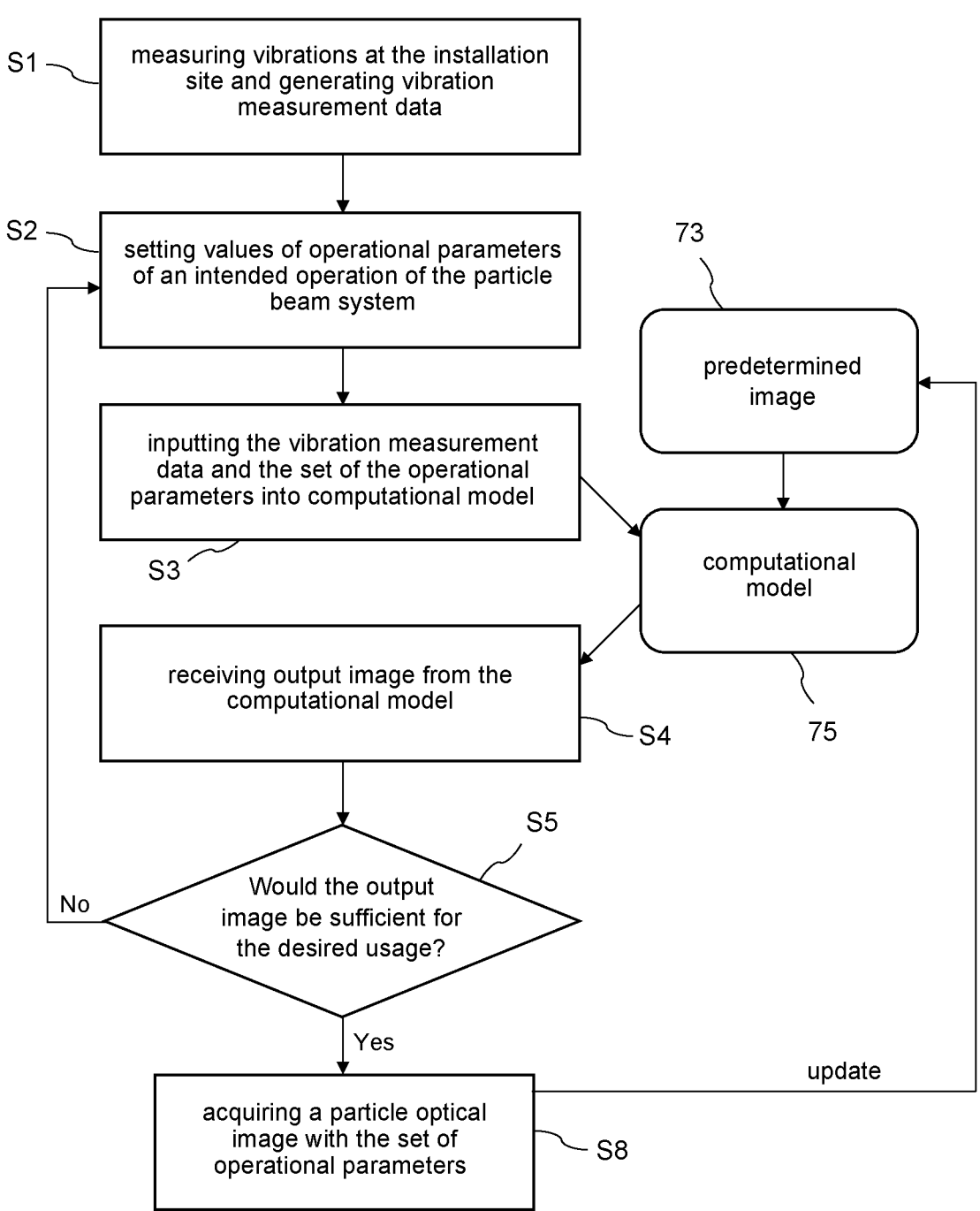
FIG. 4 illustrates a flowchart showing the method according to another embodiment.

It is emphasized that the above describes a specific embodiment and that other embodiments can be thought of. For example, FIG. 4 shows another exemplary embodiment. FIG. 4 illustrates a flowchart showing the method according to another embodiment. The method shown in FIG. 4 comprises steps S1 to S8.

The steps S1 to S5 illustrated in FIG. 4 are similar to the steps S1 to S5 shown in FIG. 3. However, in FIG. 4, the steps S1, S2, S4 and S5 are performed by the user of the particle beam system 2. Assume a case, in which the particle beam system 2 is already installed at the installation site 1. In this case, the user of the particle beam system 2 may record a vibration measurement with the sensor arrangement 3 near the installation site 1 in step S1, such that the vibration measurement sufficiently reflects the vibrations occurring at the position of the installed particle beam system 2.

The controller 25 of the particle beam system 2 may run a program module that provides the user interface. The user of the particle beam system 2 is thus able to set values of the operational parameters, such as the working distance s, the magnification of the particle beam system 2, a voltage between the particle beam source 21 and the sample 37 representing the kinetic energy of the particles incident on the sample 37, and the scan speed, of an image acquisition that the user is planning to perform with the particle beam system 2 next. The user of the particle beam system 2 sets these values in the user interface and provides a directory of the text file containing the vibration measurement data in the user interface.

In the exemplary case of FIG. 4, the steps S3 and S4 are identical to the steps S3 and S4 in FIG. 3. Namely, the data provided in the user interface is transmitted to an external computer that runs a program module providing the computational model. After inputting the provided data into the computational model 75, the computational model 75 outputs an output image, which is received by the particle beam system 2 and displayed to the user through the user interface.

In step S5, the user of the particle beam system 2 then has to decide whether the quality of the output image is sufficient, for example, for analyzing the sample with respect to structural defects. If the user of the particle beam system 2 decides that the quality of the output image is not sufficient, the user of the particle beam system 2 may return to step S2 and set different values of the operational parameters. Thus, the user is able to repeat the steps S2 to S5 until the quality of the output image is sufficient for the desired usage.

If the user of the particle beam system 2 decides in step S5 that the quality of the image is sufficient for the desired usage, the user of the particle beam system sets the values of the operational parameters in the particle beam system 2 and acquires a particle-optical image by operation the particle beam system 2 with the set values.

This is, for example, advantageous when using a sample 37 that is too sensitive to be able to scan the particle beam 23 across the sample 37 multiple times.

After performing step S8, the predetermined image 73 may be updated with the particle-optical image acquired in step S8. It is to be noted that the predetermined image 73 is not necessarily predetermined. For example, the method illustrated in FIG. 4 may include an additional step between the steps S1 and S2, in which the user of the particle beam system 2 acquires an initial image by operating the particle beam system 2. This initial image may then be transmitted together with the set values of the operational parameters and the vibration measurement data to the external computer in step S3, where it is input into the computational model 75.

Figure 5A:
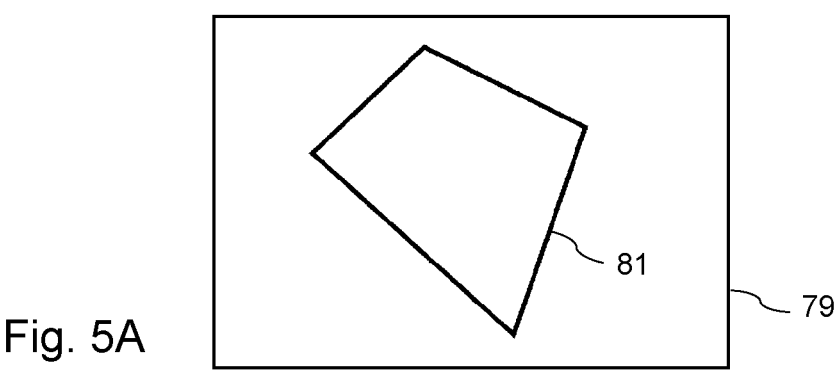
FIG. 5A illustrates a schematic input image used as an input image in a computational model.
Figure 5B:
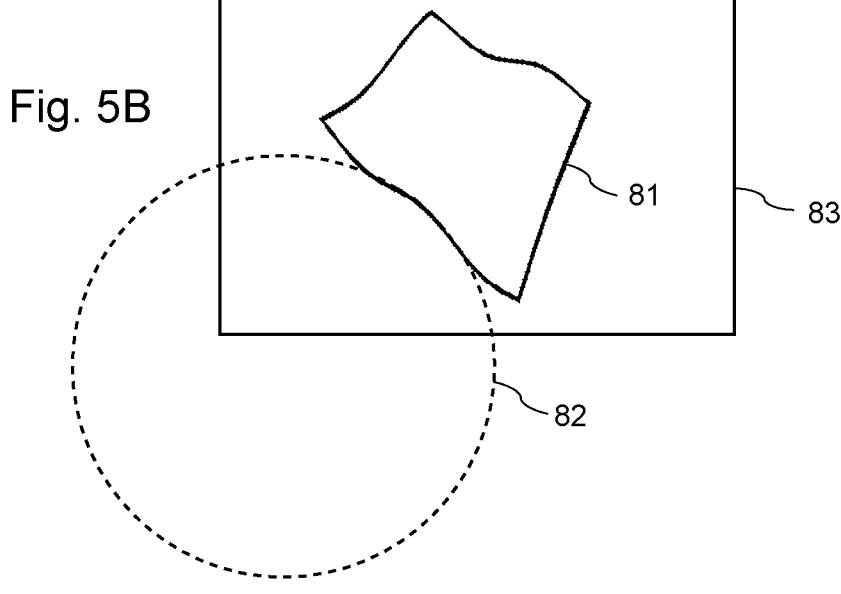
FIG. 5B illustrates a schematic output image output from the computational model when inputting the input image illustrated in FIG. 5A.
Figure 5C:
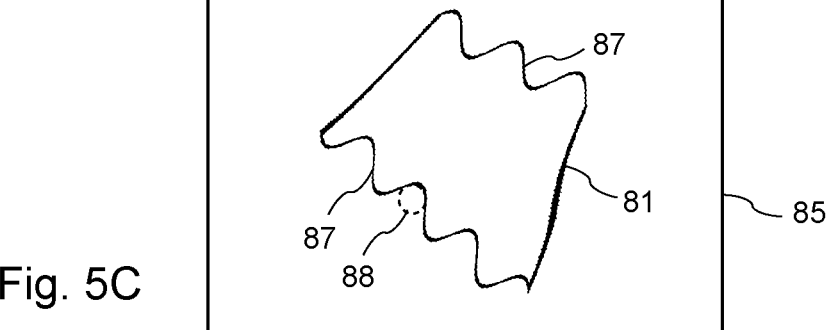
FIG. 5C illustrates a schematic output image output from the computational model when inputting the input image illustrated in FIG. 5A.

The FIG. 5A illustrates a schematic input image 79 used as an input image in the computational model 75. The input image 79 shows an object 81 with straight lines. This is emphasized by the fact that an osculating circle tangential to the lines of the object 81 in the image 79 would have a diameter much bigger than twice the width of the image 79. In fact, the diameter of an osculating circle would be infinitely big; such an osculating circle is thus not explicitly shown in FIG. 5A. FIGS. 5B and 5C illustrate schematic output images 83 and 85, also showing the same object 81. The output images 83 and 85 are received by the computational model 75 after inputting the input image 79 of FIG. 5A, vibration measurement data and two different sets of values of the operational parameters into the computational model 75. FIG. 5B shows an example of a case, in which an intensity of the vibrations at the installation site 1 are sufficiently small such that a shape of the object 81 is still recognizable. Specifically, the lines of the object 81 shown in the image 83 are not non-straight lines, since an osculating circle 82 has a sufficiently large diameter, which is, in this case, bigger than the half of the width of the image 83.

On the other hand, it is apparent that the output image 85 shows undulating lines 87 as an example of non-straight lines. To emphasize this, an osculating circle 88 is shown with dashed lines at one particular curvature of the non-straight lines 87. This osculating circle 88 has a diameter much smaller than half of the width of the image 85. Thus, at least the lower undulating line 87 is a non-straight line. The values of the operational parameters used by the computational model 75 for this output image 85 may thus be not sufficient for a proper analysis of the object 81. Therefore, the user of the particle beam system 2 may desire using the values of the operational parameters used by the computational model 75 for the output image 83, since this output image 83 is similar to the input image 79 shown in FIG. 5A. Alternatively, the user may desire installing additional suppression of the vibrations at the installation site 1, such that the values used by the computational model 75 to generate the output image 85 in FIG. 5C may still be used for acquiring images with the particle beam system 2.

It is emphasized that the images shown in the FIGS. 5A to 5C are equally applicable to the embodiment and the other embodiment.

Figure 6:
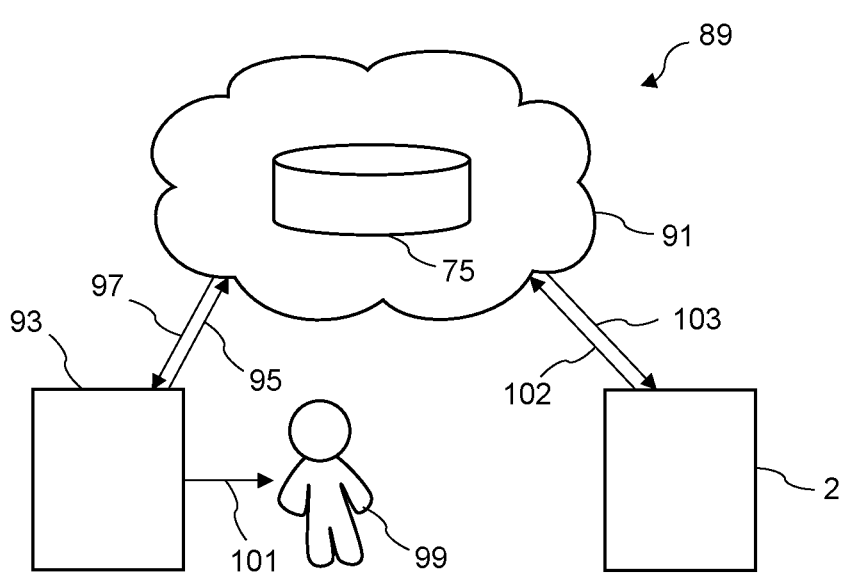
FIG. 6 schematically illustrates a data transfer according to the embodiments illustrated in FIGS. 3 and 4.

FIG. 6 schematically illustrates a data transfer according to the embodiments illustrated in FIGS. 3 and 4. For example, FIG. 6 shows a network 89 comprising the particle beam system 2, an external computer 91 and a tablet computer 93 of the service worker. According to the embodiment, as previously explained above, the service worker sets the vibration measurement data recorded in step S1, as well as the values of the operational parameters in the user interface on his tablet computer 93, which then transmits the vibration measurement data and the set values to the external computer 89 that runs a program module providing the computational model 75.

The transmission of the measurement data and the values of the operational parameters is depicted in FIG. 6 as a solid arrow 95 directed from the tablet computer 93 to the external computer 91. Specifically, the transmission represented by the solid arrow 95 may also comprise a transmission of a customized image 73 that is to be input into the computational model 75.

The external computer 91 inputs the received data into the computational model 75, which then outputs an output image. The external computer 91 transmits the output image output from the computational model 75 to the tablet computer 93, which is depicted as a solid arrow 97 directed from the external computer 91 to the tablet computer 93. It is emphasized that the data transfer represented by the arrows 95 and 97 may include further transmissions of data, such as additional operational parameters, other program parameters used in the computational model that are different from the operational parameters, a transmission date, a password for confirming the permission of the tablet computer 93 to access the program executed on the external computer 91 and the like.

The output image received by the tablet computer 93 may then be shown or sent to a user 99 of the particle beam system 2, which is illustrated as a solid arrow 101 in FIG. 6. For example, the service worker may send the output image as a document in an email attachment, may print the document, fax the document or the like.

On a right-hand side of FIG. 6, the transmission of according to the other embodiment is shown. The transmissions are depicted by solid arrows 102 and 103. For example, the measurement data and the values of the operational parameters are set in the user interface provided on the particle beam system 2. In some embodiments, a customized image 73 may also be set in the user interface. Upon submitting the data by the user of the particle beam system 2, the particle beam system 2 transmits the vibration measurement data and the set values of the operational parameters to the external computer 91, which is depicted by the solid arrow 102 directed from the particle beam system 2 to the external computer 91. Subsequently, the external computer 91 inputs the received data into the computational model 75, which then outputs an output image.

The external computer 91 transmits the output image to the particle beam system 2, which is depicted as the solid arrow 103 directed from the external computer 91 to the particle beam system 2. It is emphasized that the transmissions depicted by the solid arrows 102 and 103 may, similarly to the transmissions depicted by the solid arrows 95 and 97, additionally include other data that is different from the vibration measurement data and the set values of the operational parameters. After receiving the output image by the particle beam system 2 and presenting the output image to the user of the particle beam system 2, the user may repeat the process of steps S2 to S5 illustrated in FIG. 4 with different values of the operational parameters.

It is to be noted that the network illustrated in FIG. 6 is an example. Other networks may be possible. For example, the tablet computer 93 of the service worker may be any other computer. Since the vibration measurement data may be stored in the measurement processor 9 illustrated in FIG. 1, the service worker is able to leave the installation site and return to his office with the vibration measurement data. This is, the service worker is able to input the vibration measurement data directly into the computational model provided at his office. This case emphasizes that the present disclosure is not limited to the specific configuration shown in FIG. 6.

Figure 7:
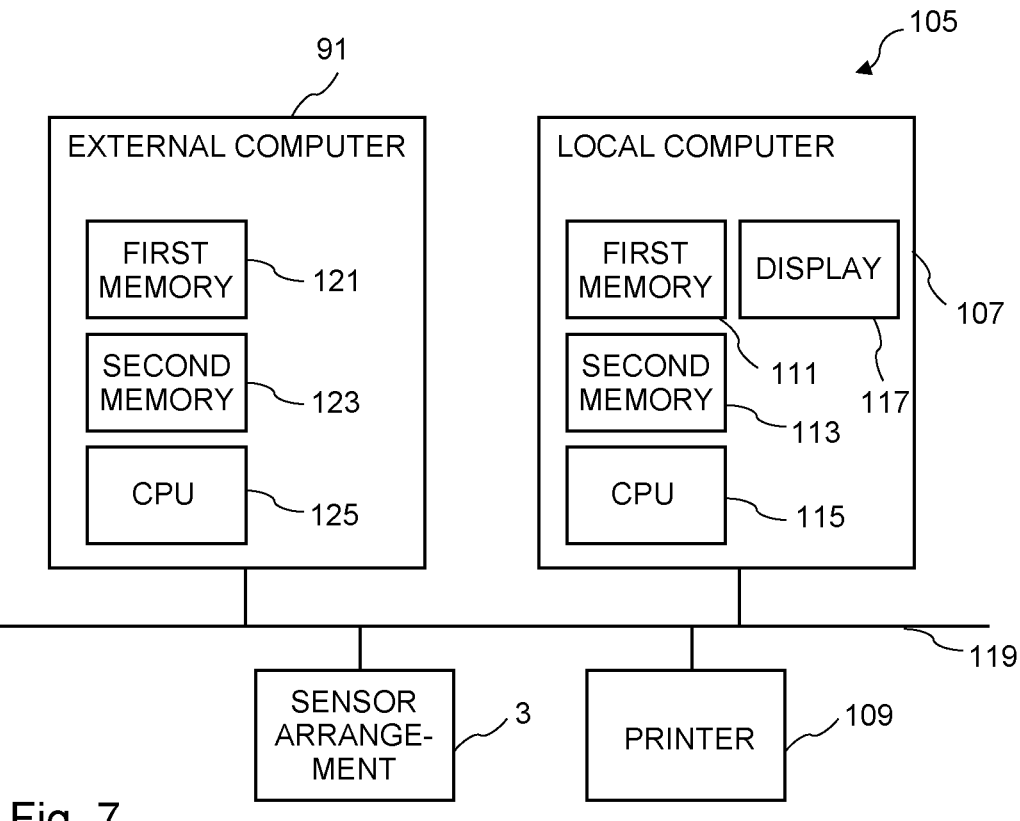
FIG. 7 illustrates a schematic network structure according to the embodiments illustrated in FIGS. 3 and 4.

FIG. 7 illustrates a schematic network structure 105 according to the embodiments illustrated in FIGS. 3 and 4. The network structure 105 comprises the external computer 91, the local computer 107, the sensor arrangement 3 and a printer 109. As previously mentioned in the description with respect to FIG. 1, the sensor arrangement 3 is connectable to the network, for example at least to the local computer 107 so as to transfer the vibration measurement data to the local computer 107.

The local computer 107 may be part of the particle beam system 2, the tablet computer 93 of the service worker or the like. The local computer comprises a first memory 111, a second memory 113, a CPU 115 and a display 117. The first memory 111 is a non-volatile storage medium that is able to store a first program module. The non-volatile storage medium may be, for example, a hard drive, a solid state drive, a compact disk, a digital versatile disk, or the like. The second memory 113 is a volatile storage medium such as a random access memory. When executing the first program module, the CPU 115 loads the first program module into the second memory 113. Upon execution of the first program module, the CPU 115 transmits instructions to the display 117 to display the user interface. The display may be, for example, a liquid crystal display.

The local computer 107 is connected to the printer 109, the sensor arrangement 3 and the external computer 91 through a bus 119. It should be noted that the connection to the external computer 91, the printer 109 and the sensor arrangement 3 is not necessarily a permanent connection, like it may seem from the illustration in FIG. 7. For example, the sensor arrangement 3 may be only temporarily connected for a short period of time to transfer the vibration measurement data into the first memory of the local computer 107. Similarly, connections of other components shown in FIG. 7 may only be present in the network 105 when these connections are established.

Upon submitting the vibration measurement data and the set values of the operational parameters in the user interface displayed on the display 117, the CPU 115 transmits the vibration measurement data and the set values of the operational parameters to the external computer 91 through the bus 119. As previously mentioned, the user interface may provide the possibility to indicate a directory of a file containing the vibration measurement data. This directory may be a directory of the first memory 111 or a storage area included in the sensor arrangement 3. Upon submitting the directory in the user interface, the CPU 115 accesses the respective memory indicated in the directory and reads the vibration measurement data from the file to transmit the vibration measurement data to the external computer 91. Alternatively, the CPU 115 may transmit a copy of the file to the external computer 91.

The external computer 91 comprises a first memory 121, a second memory 123 and a CPU 125. The first memory 121 is a non-volatile storage medium, such as a hard drive, a solid state drive, a compact disk, a digital versatile disk, or the like. The second memory 123 is a volatile storage medium, such as a random access memory. Upon receiving the vibration measurement data and the set values of the operational parameters through the bus 119 by the external computer 91, the CPU 125 of the external computer 91 stores the vibration measurement data and the set values of the operational parameters in the first memory 121. In the case of receiving a file containing the vibration measurement data, the CPU 125 further accesses the file stored in the first storage 121, reads the vibration measurement data from the file and loads the vibration measurement data into the second memory 123.

The CPU 125 also loads a second program module that is stored in the first memory 121 into the second memory 123. The second program module includes instructions and/or data that provide the computational model 75 when being loaded into a volatile storage medium. In addition, the first memory holds a predetermined input image that is loaded by the CPU 125 into the second memory 123. The external computer 91 may also receive the input image through the bus 119, in which case the CPU 125 treats the input image similarly to the vibration measurement data and the set values of the operational parameters.

The CPU 125 inputs the vibration measurement data, the set values of the operational parameters and the input image by loading them into the second memory 123 and performing computations of the computational model 75 with the vibration measurement data, the set values of the operation parameters and the input image. As a result, the CPU 125 generates an output image by performing the computations of the computational model 75 and stores the output image into the first memory 121. The CPU 125 then transmits the output image to the local computer 107.

Upon receiving the output image by the local computer 107, the CPU 115 of the local computer stores the output image into the first memory 111 of the local computer 107 and further displays the output image in the user interface displayed on the display 117. The user may then indicate in the user interface that the output image is to be printed, in which case the CPU 115 transmits a copy of the output image to the printer 109 to print the output image.

Figure 8:
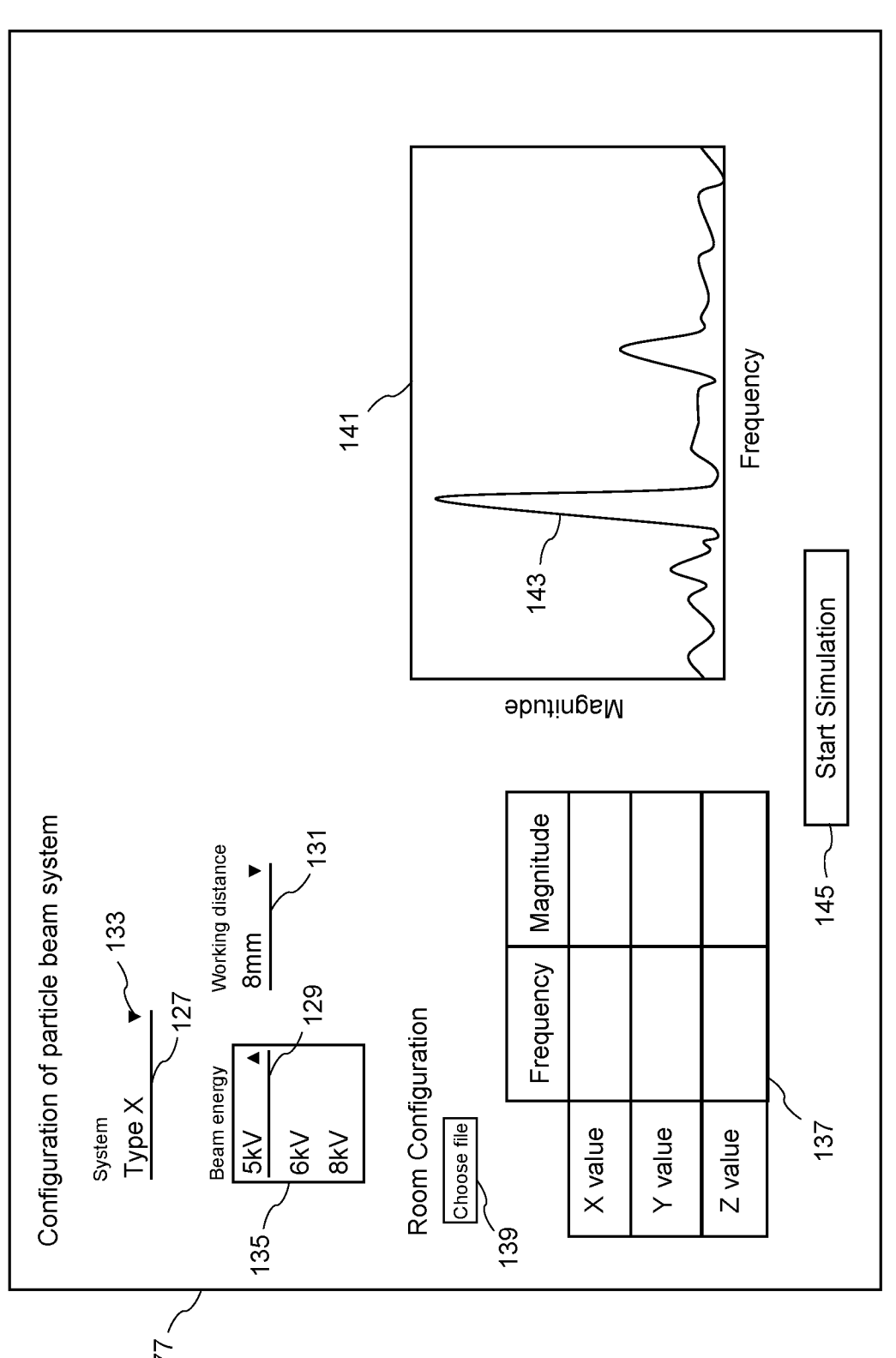
FIG. 8 illustrates a first screen of a user interface according to the embodiments illustrated in FIGS. 3 and 4.

FIG. 8 illustrates a first screen of the user interface 77 according to the embodiments illustrated in FIGS. 3 and 4. The user interface 77 includes a section for setting configuration details of the particle beam system 2, such as the type of the particle beam system 2 and the operational parameters, which are a beam energy and the working distance s in the case illustrated in FIG. 8. It is to be noted that the beam energy illustrated in FIG. 8 is equivalent to the kinetic energy of the particles of the particle beam 23 incident on the sample 37, and is only used as an abbreviation of the physical meaning.

For the user of the particle beam system 2 to be able to set the system type, the beam energy and the working distance s, the user interface 77 includes widgets 127, 129 and 131, respectively. Namely, in the case illustrated in FIG. 8, the user of the particle beam 2 has set the system type to be Type X in the widget 127, the beam energy to be 5 kV in the widget 129 and the working distance s to be 8 mm in the widget 131. These entries in the widgets 127, 129 and 131 may be default values.

As illustrated in FIG. 8, the widgets 127, 129 and 131 are drop-down menus indicated by an arrow head 133 at a rightmost position of the widgets 127, 129 and 131. The drop-down menu is illustrated in more detail with respect to the beam energy widget 129. The user of the particle beam system 2 has performed a mouse click on the widget 129 and the drop-down menu 135 has opened. The drop-down menu 135 provides several alternative and predetermined entries that can be set in the widget 129, namely the values 5 kV, 6 kV and 8 kV. When clicking on one of the provided values, the respective value is automatically inserted into the widget 129 and the drop-down menu 135 is closed.

The user interface 77 further provides a section to set the vibration measurement data. In this section, the user interface 77 provides a table 137 for typing in the vibration measurement data manually. For example, the table 137 consists of lines corresponding to each of the three dimensions of space, namely the X dimension, the Y dimension and the Z dimension, as well as columns for the frequency and the magnitude of the vibrations measured. It is noted that the computational model 75 does not necessarily use the vibration measurement data in all of the three dimensions. For example, the computational model 75 may generate the output image based on the dimension in which the magnitude of the vibrations is the highest. Other embodiments are possible.

Since the quantity of vibration measurement data that can be typed in the table 137 is limited, the user interface 77 also provides a button 139 to indicate a directory of a file containing the vibration measurement data. The user interface 77 may desire the file containing the vibration measurement data to be in a specific format, such as a text file that can be accessed by typically used operating systems. Choosing the directory of the file may be realized by typing in the directory via a keyboard, by providing an overview of available directories and clicking on the directory of the file, or the like. After indicating the directory of the file containing the measurement data, the directory may be shown next to the button 139, for example, to the right of the button 139.

The user interface 77 further includes a diagram 141 illustrating a graph 143 corresponding to the provided vibration measurement data. For example, the diagram 141 has an X-axis representing the frequency of the vibration measurement data and a Y-axis representing the magnitude of the vibration measurement data. The diagram 141 illustrated in FIG. 8 only illustrates the vibration measurement data in one dimension. However, the diagram 141 may show the vibration measurement data in all dimensions by graphs of different colors. Alternatively, the user interface 77 may include several diagrams 141, each illustrating the vibration measurement data in one dimension. In the case of choosing a file with the button 139, the vibration measurement data first has to be read from the file to be able to illustrate the vibration measurement data in the diagram 141.

The user interface 77 further comprises a button 145. Clicking on the button 145 submits the set data and starts the simulation by inputting the vibration measurement data and the set values of the operational parameters in the computational model 75. Subsequently, the user interface 77 proceeds to a second screen, which is shown in FIG. 9.

Figure 9:
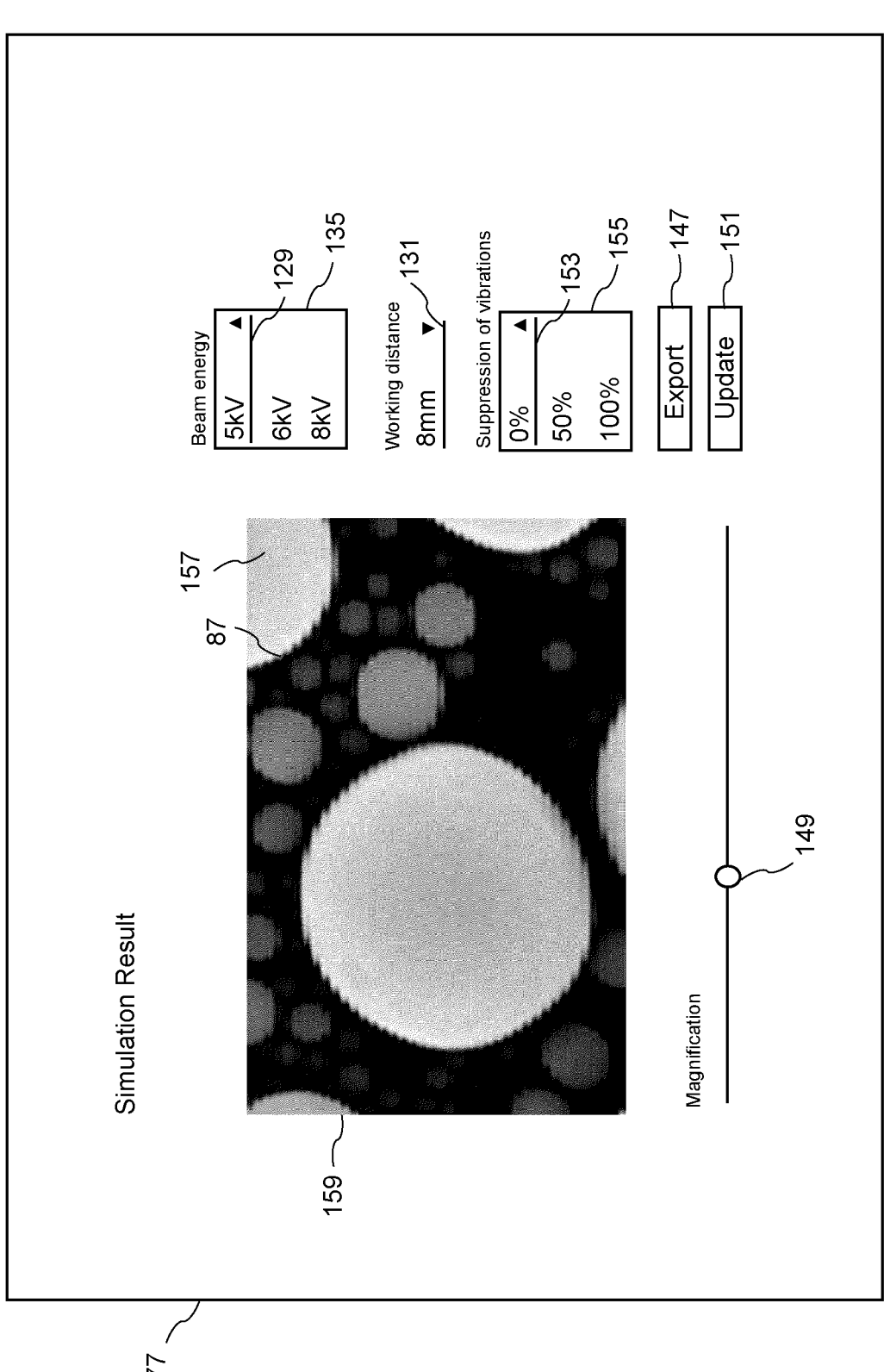
FIG. 9 illustrates a second screen of the user interface according to the embodiments illustrated in FIGS. 3 and 4.

FIG. 9 illustrates the second screen of the user interface 77 according to the embodiments illustrated in FIGS. 3 and 4. For example, the second screen shows a result of a simulation performed with an input image that is a particle-optical image of gold particles 157. The user interface 77 provides the output image 159 showing the gold particles 157 having non-straight lines. The user of the particle beam system 2 is able to export the output image 159 by pressing a button 147. For example, upon clicking the button 147, a PDF file is generated that includes the output image and the set operational parameters, as well as the vibration measurement data. The user is also able to change a magnification of the output image by operating a slide bar 149.

The user interface 77 also provides the possibility to follow negative outcome in step S5 illustrated in FIG. 4. For example, the second screen of the user interface 77 also includes the widgets 129 and 131, such that the user of the particle beam system 2 is able to change the previously set values of the operational parameters again. The user of the particle beam system 2 is thus able to set other values of the operational parameters and click on a button 151 that works similarly to the button 145. Namely, when clicking on the button 151, the changed values of the operational parameters are input again into the computational model 75, and the output image output by the computational model 75 is again shown in the second screen of the user interface 77.

The second screen of the user interface 77 further comprises a widget 153 to include a vibration suppression in the computational model 75. For example, the user of the particle beam system 2 is able to set a suppression percentage through a drop-down menu 155 of the widget 153 and update the output image by clicking on the button 151. For example, the suppression of the vibrations may be computed by multiplying the vibrations in each dimension with a decimal representation of the percentage set in the widget 153. In this way, an influence of a vibration suppression installed at the installation site can be visualized, such that the user of the particle beam system can more easily assess whether or not an installation of an additional vibration suppression is beneficial.

It is emphasized that, although the above described embodiments mainly refer to a network structure including an external computer 91 and a local computer 107, the present disclosure is not limited to such a network structure. For example, the first program module and the second program module may be executed on the same computer. This is, a single local computer 107 is able to provide the user interface 77 and the computational model 75. In this case, the local computer 107 does not need to transmit any data to another computer. Rather, the local computer 107 is able to directly input the vibration measurement data and the values of the operational parameters set in the user interface 77 into the computational model 75. In this case, the first program module and the second program module described with respect to FIG. 7 may be loaded into a single versatile storage medium and executed by a single CPU.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A method for handling a particle beam system at an installation site, the method comprising:
providing a computational model which receives an input image, values of operational parameters defining an operation of the particle beam system, and vibration data representing vibrations of the particle beam system and which outputs an output image based on a simulation of the operation of the particle beam system;
measuring vibrations at the installation site using at least one vibration sensor;
generating vibration measurement data representing the measured vibrations;
setting values of the operational parameters of an intended operation of the particle beam system;
providing the input image;
inputting the vibration measurement data and the set values of the operational parameters into the computational model and receiving the output image output from the computational model; and
performing an action based on an analysis of the output image,
wherein the simulation operates such that:
features of the input image represented as straight lines correspond to features of the output image represented as straight lines when the vibration data represent vibrations of a low intensity; and
features of the input image represented as straight lines correspond to features of the output image represented as non-straight lines when the vibration data represent vibrations of a high intensity, and wherein the operational parameters represent a member selected from the group consisting of:
a working distance between an objective lens of the particle beam system and a sample to be inspected with the particle beam system;
a kinetic energy of particles incident on the sample; and
a scan speed used when scanning the beam of particles across the sample when an image is recorded using the particle beam system.

2. The method of claim 1, wherein measuring the vibrations comprises measuring seismic vibrations of a floor at the installation site and measuring acoustical vibrations of air at the installation site.

3. The method of claim 1, wherein the action comprises installing the particle beam system at the installation site.

4. The method of claim 3, wherein the action further comprises installing a vibration damper and/or an acoustic insulation configured to reduce the intensity of the vibrations.

5. The method of claim 1, wherein the action comprises refraining from installing of the particle beam system at the installation site.

6. The method of claim 1, wherein the action comprises setting the values of the operational parameters in the particle beam system and recording a particle-optical image using the particle beam system.

7. The method of claim 1, wherein performing the action based on the analysis of the output image comprises receiving an input triggering the action from a user.

8. The method of claim 1, wherein setting the values comprises receiving the values from a user.

9. The method of claim 8, wherein:
receiving the values from the user comprises providing a user interface to the user, wherein the user interface provides a widget for allowing the user to input the values; and
receiving further comprises obtaining the values inputted by the user from the widget.

10. The method of claim 9, wherein:
the user interface is provided by a first program module that is executed by a first computer; and
the computational model is provided by a second program module that is executed by a second computer that is different from the first computer.

11. The method of claim 10, wherein:
inputting the vibration measurement data and the set values of the operational parameters into the computational model comprises transmitting the vibration measurement data and the values of the operational parameters from the first computer to the second computer; and
receiving the output image output from the computational model comprises receiving the output image from the second computer by the first computer.

12. The method of claim 1, further comprising: generating a document comprising the output image, wherein the document further comprises values of program parameters that have been used in the computational model to output the output image.

13. The method of claim 12, wherein the program parameters represent at least one of:
a magnification of the particle beam system;
the working distance between the objective lens of the particle beam system and the sample to be inspected with the particle beam system;
the kinetic energy of particles incident on the sample; and the scan speed used when scanning the beam of particles across the sample when an image is recorded using the particle beam system.

14. The method of claim 1, wherein the provided input image is predetermined.

15. The method of claim 14, wherein the predetermined image comprises a particle-optical image acquired by operating another particle beam system that is different from the particle beam system.

16. The method of claim 1, wherein providing the input image comprises acquiring a particle-optical image by operating the particle beam system.

17. The method of claim 1, wherein:

a line in the image is a straight line when all osculating circles to the line have a diameter of more than two times a greatest width of the image; and the line in the image is a non-straight line when at least one osculating circle to the line has a diameter less than half of the greatest width of the image.

18. One or more machine-readable hardware storage devices comprising instructions that are executable by one or more processing devices to perform operations comprising the method according to claim 1.

19. A system comprising:

one or more processing devices; and one or more machine-readable hardware storage devices comprising instructions that are executable by the one or more processing devices to perform operations comprising the method according to claim 1.

20. The system of claim 19, further comprising:

a particle beam source configured to generate a particle beam;

an objective lens configured to focus the particle beam onto a sample to be scanned using the particle beam system;

a deflector arrangement configured to scan the particle beam across a surface of the sample;

a detector configured to generate a signal corresponding to an amount of particles incident on the detector;

a stage configured to hold the sample; and a controller configured to control operation of the particle beam source, operation of the objective lens, and operation of the deflector arrangement, and configured to receive signals generated by the detector.

21. A method for handling a particle beam system, the method comprising:

providing a computational model which receives an input image, values of operational parameters defining an operation of the particle beam system, and vibration data representing vibrations of the particle beam system and which outputs an output image based on a simulation of the operation of the particle beam system;

receiving vibration measurement data representing vibrations;

setting values of the operational parameters of an intended operation of the particle beam system;

providing the input image;

inputting the vibration measurement data and the set values of the operational parameters into the computational model;

receiving the output image output from the computational model; and outputting the output image, wherein the simulation operates such that:

features of the input image represented as straight lines correspond to features of the output image represented as straight lines when the vibration data represent vibrations of a low intensity; and features of the input image represented as straight lines correspond to features of the output image represented as non-straight lines when the vibration data represent vibrations of a high intensity, and wherein the operational parameters represent at least one of:

a working distance between an objective lens of the particle beam system and a sample to be inspected with the particle beam system;

a kinetic energy of particles incident on the sample; and a scan speed used when scanning the beam of particles across the sample when an image is recorded using the particle beam system.

* * * * *